United States Patent

Wright

Patent Number: 5,115,299
Date of Patent: * May 19, 1992

[54] HERMETICALLY SEALED CHIP CARRIER WITH ULTRA VIOLET TRANSPARENT COVER

[75] Inventor: John O. Wright, Warren, Pa.

[73] Assignee: GTE Products Corporation, Stamford, Conn.

[*] Notice: The portion of the term of this patent subsequent to Feb. 5, 2008 has been disclaimed.

[21] Appl. No.: 379,400

[22] Filed: Jul. 13, 1989

[51] Int. Cl.⁵ .................. H01L 23/28; H01L 39/02
[52] U.S. Cl. ............................. 357/72; 357/80; 174/52.4
[58] Field of Search ............ 357/72, 70, 80; 174/52.4, 52.2

[56] References Cited

U.S. PATENT DOCUMENTS

| | | | |
|---|---|---|---|
| 4,008,945 | 2/1977 | Scherer | 350/1 |
| 4,012,579 | 3/1977 | Fox et al. | 174/52 PE |
| 4,105,861 | 8/1978 | Hascoe | 174/52 FP |
| 4,697,203 | 9/1987 | Sakai et al. | 357/72 |
| 4,811,081 | 3/1989 | Lyden | 357/80 |
| 4,843,695 | 8/1989 | Doe et al. | 29/827 |
| 4,990,719 | 2/1991 | Wright | 174/52.4 |

FOREIGN PATENT DOCUMENTS

| | | | |
|---|---|---|---|
| 0135425 | 5/1979 | German Democratic Rep. | 357/72 |
| 54-129880 | 8/1979 | Japan | 357/72 |
| 58-16550 | 1/1983 | Japan | 357/72 |
| 58-89844 | 5/1983 | Japan | 357/72 |
| 60-35541 | 2/1985 | Japan | 357/72 |

OTHER PUBLICATIONS

Webster's II Dictionary, ©1984, p. 947.

Primary Examiner—Andrew J. James
Assistant Examiner—D. Monin
Attorney, Agent, or Firm—William H. McNeill

[57] ABSTRACT

A hermetically sealed chip carrier including a lead frame for use with an EEPROM chip, the carrier including a pre-molded plastic beam and an ultra violet transparent cover.

12 Claims, 1 Drawing Sheet

HERMETICALLY SEALED CHIP CARRIER WITH ULTRA VIOLET TRANSPARENT COVER

BACKGROUND OF THE INVENTION

1. Field of the Invention

This invention relates to a hermetically sealed chip carrier including a lead frame for use with an electrically erasable programmable read only memory (EEPROM) chip.

2. Description of the Prior Art

The manufacture of lead frames is disclosed in, for example, U.S. Pat. Nos. 4,204,317; 4,137,546; 3,750,277; 3,537,175; and 3,469,953. Typically a chip is mounted on a lead frame, electrically connected to the leads thereof, and packaged. Examples of such structure are described in U.S. Pat. Nos. 4,744,009; 4,727,221; 4,691,225; 4,663,651; 4,663,650; 4,635,165; 4,326,214; 4,135,038; 4,105,861; 3,943,623; 3,874,549; 3,660,819 and 3,404,215.

Typically, an EEPROM chip is packaged in a hermetically sealed ceramic package, known in the art as a "CERDIP" package, which incorporates an ultra violet (UV) transparent glass or quartz window. In the manufacture of such structures relatively high temperatures are required in the sealing operation and this results in reduced yields. Such a ceramic package tends to be inherently expensive. In addition, typical transparent covers heretofor used in CERDIP packages have been quartz in ceramic, which is expensive. Further, the use of ceramic covers has inhibited variation in size and shape of the window, the tradition window being formed from extruded quartz bars which are sliced for use in the ceramic cover.

It is an object of this invention to produce an EEPROM chip carrier which can be hermetically sealed at relatively low temperatures thereby increasing yields and reducing costs. A further object is to provide an EEPROM chip carrier using materials which are less expensive and easier to work than ceramic. It is also an object to provide an EEPROM carrier having a cover which inherently provides the UV transparent window and result of which a cover/window can be provided which accommodates any chip such as, for example, the relatively larger chips presently being used.

SUMMARY OF THE INVENTION

This invention achieves these and other objects by providing a hermetically sealed chip carrier, and method of forming same, comprising a pre-molded base comprising thermosetting plastic and including a recessed portion bounded by a first peripheral wall. A first epoxy B-stage preform is also providing having a first surface which engages the base and is adhered thereto, and an opposite second surface. The first epoxy B-stage preform includes an open area through which the first peripheral wall extends, and a die pad engaging area within the open area. A lead frame is provided having a first side which engages the opposite second surface and is adhered thereto, and an opposite second side. The lead frame includes a die pad adjacent the open area and adhered to the opposite second surface at the die pad engaging area. A chip is provided having a first area which engages the die pad and an opposite second area, the chip being electrically connected to the lead frame strip. A second epoxy B-stage preform is provided having a lower surface which engages the lead frame strip and is adhered thereto, and an opposite upper surface. The second epoxy B-stage preform includes a peripheral edge portion and an open central portion. An ultra violet transparent cover is bonded to the pre-molded base by the peripheral edge portion. Means associated with the pre-molded base and the lead frame is also provided from aligning the lead frame relative to the pre-molded base.

DESCRIPTION OF THE PREFERRED EMBODIMENT

Figure 1:
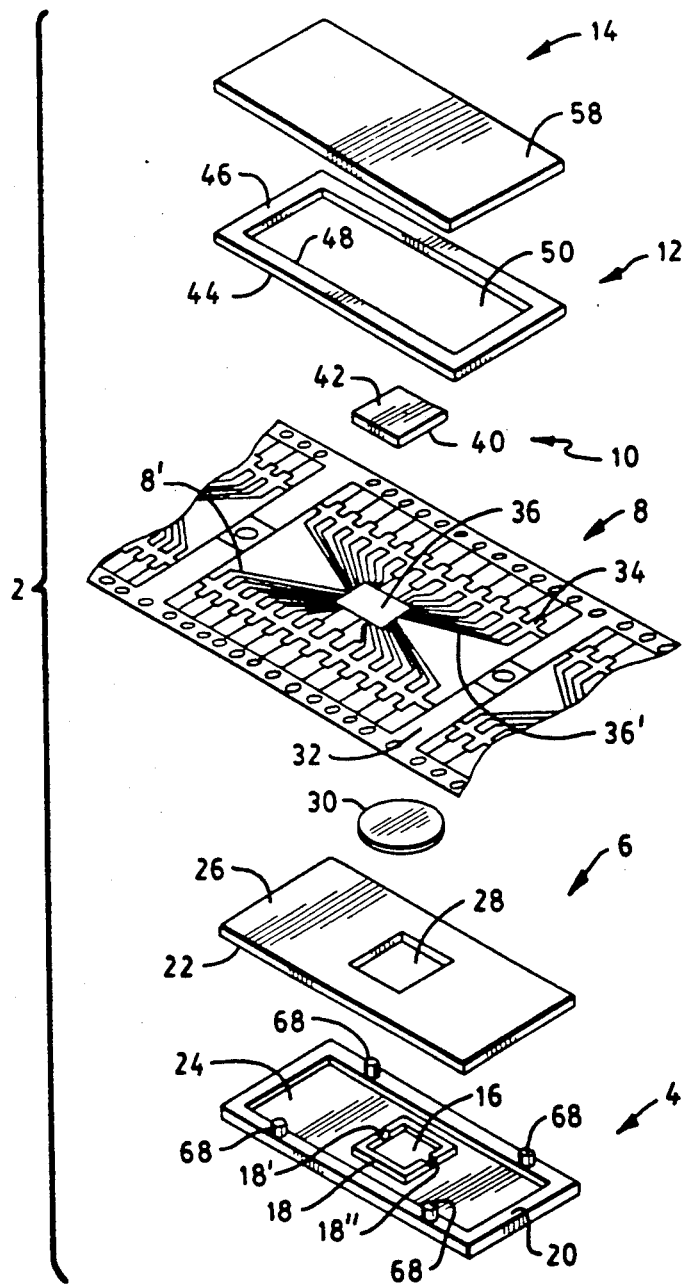
FIG. 1 is a partially cut away exploded view representing a chip carrier of the present invention.

The embodiment which is illustrated in the drawings is particularly suited from achieving the objects of this invention. FIG. 1 depicts an exploded view of a hermetically sealed chip carrier 2 which includes a base 4, first epoxy B-stage preform 6, lead frame 8, chip 10, second epoxy B-stage preform 12 and cover 14.

In the preferred embodiment base 4 is molded in a known manner using thermosetting plastic to form a pre-molded base. Examples of such a thermosetting plastic are known epoxy molding compounds made by Nitto, Hysol and others. However, preferably the base is molded using a thermoplastic material such as ULTEM which is a trademark of General Electric Company. Pre-molded base 4 includes a recessed portion 16 bounded by a first peripheral wall 18 having slots 18' and 18". A second peripheral wall 20 extends about the periphery of the pre-molded base 4. Peripheral walls 12 and 20 are preferably molded integrally with the base 4.

The first epoxy B-stage preform 6 includes a first surface 22 which engages the base 4 at surface 24, and an opposite second surface 26. The preform 6 also includes an open area 28 through which wall 18 extends, and a separated die pad engaging member 30 within the open area 28. The first surface 22 and the die pad member 30 are adhered to the surface 24 and recessed portion 16, respectively, of the base 4 as explained herein. Preform 6 can be formed from any of many well-known B-stage epoxy materials such as, without limitation, TE-150 made ay Amicon.

The lead frame 8 is well-known in the art and will not be described in detail herein except to note that typically it is stamped from a metal strip formed of copper alloys and includes leads, the inner ends of which are eventually electrically connected to an EEPROM chip such as chip 10 in a known manner, the lead frame being held together by supports 8'. Lead frame 8 includes a first side 32 which engages surface 26 of the preform 6 and is adhered thereto as described herein, and an opposite second side 34. Lead frame strip 8 also includes a slightly depressed die pad 36 mounted to the lead frame supports by ribs 36'. Die pad 36 is adjacent the open area 28, and adhered to the recessed portion 16 by member 30, ribs 36' extending through slots 18'and 18".

In the preferred embodiment, the lead frame is a phosphor bronze material plated and/or provided with an inlay of silver, gold or aluminum, all as is known in the art, and includes leads electrically connected to EEPROM chip 10 in a known manner. Chip 10 includes a first area 40 which engages the inlay 36 and an opposite second area 42.

A second epoxy B-stage preform 12 is provided. Preform 12 includes a lower surface 44, which engages the surface 34 of the lead frame and is adhered thereto as described herein, and an opposite upper surface 46. Preform 12 is formed by a peripheral edge portion 48 and an open central portion 50. As in the case of preform 6, preform 12 can be formed from any of many well-known B-stage epoxy material such as, for example, those noted above with respect to preform 6.

A cover 14 is provided to complete the assembly. Cover 14 is an ultra violet transparent material which is bonded to the pre-molded base 4 by the peripheral edge portion 48 of the preform 12 as described herein. Preferably, the cover is bonded to the second peripheral wall 20. Since the cover 14 is an ultra violet transparent material it forms a window in its entirety as a result of which a cover/window is provided which accommodates any chip such as, for example the relatively larger chips being used today. In one preferred embodiment the ultra violet transparent cover is a cast material such as, for example, glass, or quartz, produced in a known manner. In an alternate embodiment the ultra violet transparent cover is a thermoplastic material. By way of example only, such thermoplastic material can be molded in a known manner.

The materials of the chip carrier described herein can be hermetically sealed at low temperatures thereby increasing yields and reducing costs relative to ceramic devices, the constituent materials also being less expensive and easier to work than ceramic.

Means associated with the pre-molded base 4 is provided for properly aligning the lead frame 8 during assembly. For example, a plurality of protuberances 68 extend from the pre-mold base 4 and extend between various leads of the lead frame 8. Preferably, the height of the protuberances 68 will be equal to the thickness of the lead frame 8.

The carrier of the present invention can be hermetically sealed at low temperatures thereby increasing yields and reducing cost relative to ceramic carriers, and the materials used are less expensive and easier to work than ceramic. In addition, the cover can be readily varied in size and shape to accommodate the larger chip used today. In use, the chip carrier can be produced as a completed unit having a chip hermetically sealed therein, or can be produced in such a manner that a customer of the chip carrier can insert whatever chip is desired and then seal the chip carrier to effect the hermetically sealed structure. For example, the chip carrier can be produced comprising a first sub-component in the form of the pre-molded base with the first epoxy B-stage preform and lead frame strip adhered thereto and a second sub-component in the form of the cover with the second epoxy B-stage preform adhered thereto. The first and second sub-components are shipped to the customer who attaches the desired chip to the lead frame and adheres the metal cover to the pre-molded base.

Figure 2:
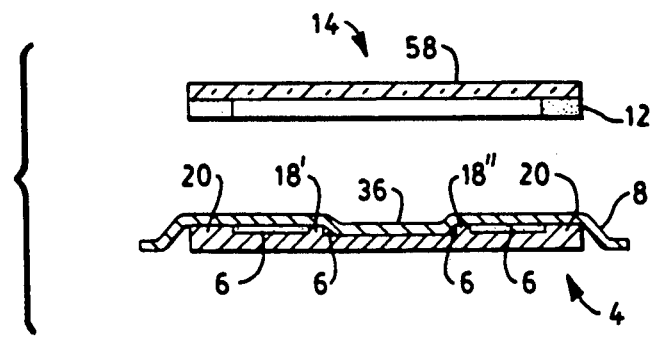
FIG. 2 is a cut away exploded view of the chip carrier of the present invention partially assembled.

Regardless of where the device is assembled, the method includes the step of forming a first sub-assembly by (a) adhering a first surface of a first epoxy B-stage preform to a pre-molded plastic base by heating to a first predetermined temperature sufficient to cause the adhering without curing the first epoxy B-stage preform, and (b) adhering a lead frame to the pre-molded plastic base by clamping the lead frame to the pre-molded plastic base at an opposite second surface of the first epoxy B-stage preform and heating to a second predetermined temperature sufficient to cause the adhering and cure the first epoxy B-stage preform. For example, when the base is a thermoplastic such as is produced under the General Electric Company trademark ULTEM and the first epoxy preform is TE-150, the first epoxy preform is adhered to the base at a first pre-determined temperature of less than 100° C. for about ten (10) minutes and the lead frame is adhered to the base and cured at a second predetermined temperature of about 150° C. for about one (1) hour. Upon completion of this step the lead frame will rest upon the wall 18 and the wall 20, the die pad will reside in the recess portion 16, and the cured first epoxy B-stage preform will have flowed upon surfaces 16 and 24 and between the lead frame fingers. This is generally depicted in FIG. 2. The base with lead frame can be formed as a single unit. Alternatively, a plurality of bases with respective lead frames associated therewith can be formed in a continuous process in the form of a flat strip or a strip which has been rolled into a reel. In other words, a strip of lead frames can be attached to a strip of pre-molded bases as discussed above and shipped to a customer who can cut individual base/lead frames therefrom as desired.

A second sub-assembly is then formed by adhering an upper surface of a second epoxy B-stage preform to a cover, which is an ultra violet transparent material, by heating to a third predetermined temperature sufficient to cause the adhering without curing the second epoxy B-stage preform. When the cover is glass or quartz and the second epoxy preform is TE-150 the second epoxy preform is adhered to the cover at a third predetermined temperate of less than 100° C. for about ten (10) minutes. The cover 14 with preform 12 is depicted in FIG. 2.

The chip 10 is then adhered to a die pad of the lead frame and electrically coupled to the lead fame in a known manner. Finally, the assembly is completed by adhering the first sub-assembly to the second sub-assembly by clamping the first sub-assembly to the second sub-assembly and heating to a fourth predetermined temperature sufficient to cause the adhering and cure the second epoxy B-stage preform. The fourth predetermined temperature will be about 150° C. for about one (1) hour.

The embodiments which have been described herein are but some of several which utilize this invention and are set forth here by way of illustration but not of limitation. It is apparent that many other embodiments which will be readily apparent to those skilled in the art may be made without departing materially from the spirit and scope of this invention.

I claim:

1. A hermetically sealed chip carrier, comprising:
   a pre-molded base comprising plastic and including a recessed portion bounded by a first peripheral wall;
   a first epoxy B-stage preform having a first surface which engages said base and is adhered thereto, and an opposite second surface, said first epoxy B-stage preform including an open area through which said first peripheral wall extends, and a die pad engaging area within said open area;
   a lead frame having a first side which engages said opposite second surface and is adhered thereto, and an opposite second side, said lead frame having a die adjacent said open area and adhered to said opposite second surface at said die pad engaging area;

a chip having a first area which engages and is adhered to said die pad and an opposite second area, said chip being electrically connected to said lead frame;

a second epoxy B-stage preform having a lower surface which engages said lead frame and said base and is adhered thereto, and an opposite upper surface, said second epoxy B-stage preform including a peripheral edge portion and an open central portion;

an ultra violet transparent cover bonded to said pre-molded base by said peripheral edge portion; and means associated with said pre-molded base for aligning said lead from relative to said pre-molded base.

2. The hermetically sealed chip carrier of claim 1 wherein said ultra violet transparent cover is a cast material.

3. The hermetically sealed chip carrier of claim 2 wherein said cast material is glass.

4. The hermetically sealed chip carrier of claim 2 wherein said cast material is quartz.

5. The hermetically sealed chip carrier of claim 1 wherein said ultra violet transparent cover is a thermoplastic material.

6. The hermetically sealed chip carrier of claim 5 wherein said thermoplastic material is molded.

7. The hermetically sealed chip carrier of claim 1 wherein said pre-molded base includes a second peripheral wall which extends about the periphery of said pre-molded base and to which said ultra violet transparent cover is bonded.

8. The hermetically sealed chip carrier of claim 7 wherein said aligning means includes a plurality of protuberances extending from said pre-molded base.

9. A hermetically sealed chip carrier, comprising:

a pre-molded base comprising plastic and including a recessed portion bounded by a first peripheral wall;

a first epoxy B-stage preform having an open are and including a die pad engaging portion within said open area, said preform having a first surface which engages said base and is adhered thereto and an opposite second surface which can be adhered to a first surface of a lead fame having a die pad which can carry a chip;

an ultra violet transparent cover; and, a second epoxy B-stage preform having an upper surface which engages said cover and is adhered thereto and an opposite lower surface which can be adhered to an opposite second surface of said lead frame and to said pre-molded base to bond said cover to said pre-molded base.

10. The hermetically sealed chip carrier of claim 9 further including means associated with said pre-molded base for aligning said lead frame relative to said pre-molded base.

11. The hermetically sealed chip carrier of claim 9 wherein said first peripheral wall extends through said open area and said die pad engaging portion engages and is adhered to said recessed portion.

12. The hermetically sealed chip carrier of claim 9 wherein said second epoxy B-stage perform comprises a peripheral edge portion and an open central portion.

* * * * *